United States Patent [19]

Hashimoto

[11] Patent Number: 4,515,269

[45] Date of Patent: May 7, 1985

[54] MAGAZINE FOR ELECTRONIC DEVICES

[75] Inventor: Tadashi Hashimoto, Nagahama, Japan

[73] Assignee: Mitsubishi Plastics Industries Limited, Tokyo, Japan

[21] Appl. No.: 452,898

[22] Filed: Dec. 27, 1982

[30] Foreign Application Priority Data

| Dec. 29, 1981 | [JP] | Japan | 56-198679 |
| Aug. 4, 1982 | [JP] | Japan | 57-118439 |
| Aug. 4, 1982 | [JP] | Japan | 57-118440 |
| Sep. 24, 1982 | [JP] | Japan | 57-144540 |

[51] Int. Cl.³ .............................. B65D 85/30
[52] U.S. Cl. ..................... 206/334; 206/328
[58] Field of Search ................... 206/328, 334

[56] References Cited

U.S. PATENT DOCUMENTS

| 2,757,792 | 8/1956 | Shioleno | 206/331 |
| 3,133,635 | 5/1964 | Gordon et al. | 206/366 |
| 3,435,949 | 4/1969 | Suverkropp | 206/332 |
| 4,293,070 | 10/1981 | Ohlbach | 206/328 |
| 4,355,719 | 10/1982 | Hinds et al. | 206/334 |

FOREIGN PATENT DOCUMENTS

| 3129138 | 7/1981 | Fed. Rep. of Germany . |
| 24192 | 6/1976 | Japan . |
| 945522 | 1/1964 | United Kingdom . |
| 1242722 | 8/1971 | United Kingdom . |
| 2003838 | 3/1979 | United Kingdom . |
| 1554146 | 10/1979 | United Kingdom . |

Primary Examiner—Marion E. McCamish
Assistant Examiner—P. R. Schwartz
Attorney, Agent, or Firm—Oblon, Fisher, Spivak, McClelland & Maier

[57] ABSTRACT

A magazine for electronic devices, prepared by folding a flat plastic sheet into a tubular structure comprises a bottom wall, two side walls and a top wall. At east one and at most three of said walls are partly or entirely formed by a double-sheet structure.

16 Claims, 7 Drawing Figures

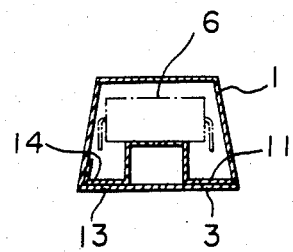
FIGURE 4
FIGURE 5
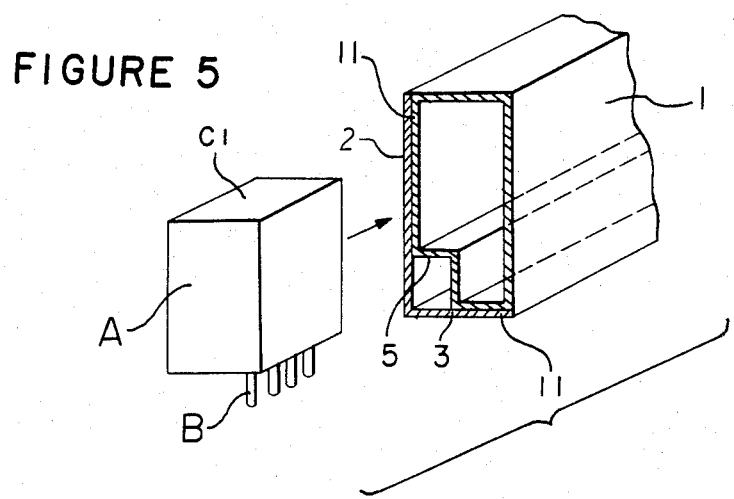
FIGURE 6
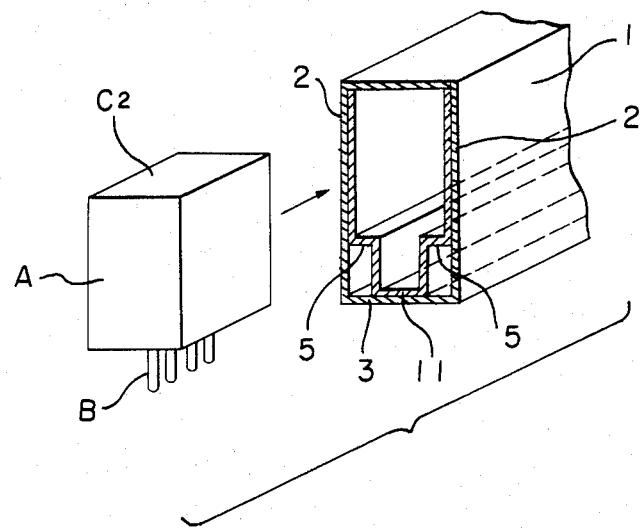

4,515,269

MAGAZINE FOR ELECTRONIC DEVICES

BACKGROUND OF THE INVENTION

The present invention relates to a tubular magazine for electronic devices such as integrated circuits.

For the production of tubular magazines for electronic devices, it has been common to employ a so-called profile extrusion method in which a plastic material is melt-extruded from an orifice having a predetermined profile depending upon the cross sectional shape of the particular devices to be inserted in the magazine. However, it is practically difficult to obtain a magazine having a thin wall thickness and an accurate dimension by such profile extrusion. Reflecting the minaturization of the electronic devices, the magazine for such devices is required to be made in a correspondingly small size. Especially when such a small size magazine is prepared by the profile extrusion to have a thin wall thickness and a simple profile such as a generally rectangular cross sectional profile, the product is quite likely to be deformed. Further, such a magazine tends to undergo deflection or twisting, and when the electronic devices are automatically supplied from the magazine to a automatic assembling line of integrating circuits, such deflection or twist hinders smooth movement of the devices in the magazine. In order to avoid such difficulties, the magazines have been prepared to have a thickness substantially greater than actually required. Such an unnecessarily great thickness adds to the cost, thus leading to an economical disadvantage. Further, the transparency of the magazines tends to be poor with the increased thickness.

It is accordingly desired to reduce the wall thickness for the magazines. The present inventor has attempted to prepare a magazine having a thin wall thickness by folding a thin plastic sheet into a tubular structure. However, such a magazine tends to be susceptible to deformation when an outer force is applied thereto, and thus has poor dimensional stability.

SUMMARY OF THE INVENTION

It is accordingly an object of the present invention to provide a magazine for electronic devices which have a relatively thin wall thickness and yet has adequate dimensional stability.

Thus, the present invention provides a magazine for electronic devices, prepared by folding a flat plastic sheet into a tubular structure comprising a bottom wall, two side walls and a top wall, wherein at least one and at most three of said walls are partly or entirely formed by a double-sheet structure i.e. a lamination of two sheets.

BRIEF DESCRIPTION OF THE DRAWINGS

Now, the present invention will be described in detail with reference to preferred embodiments illustrated in the accompanying drawings.

FIG. 4 is a cross section of the magazine of FIG. 3.

FIG. 5 is a perspective view of a fourth embodiment in which a stand to support electronic devices is formed at one inner lower corner of a rectangular cross sectional tubular structure.

FIG. 6 is similar to FIG. 5, but illustrates a fifth embodiment in which a stand for electronic devices is provided at each inner lower corner of a rectangular cross sectional tubular structure.

DETAILED DESCRIPTION OF THE PREFERRED EMBODIMENTS

Figure 1:
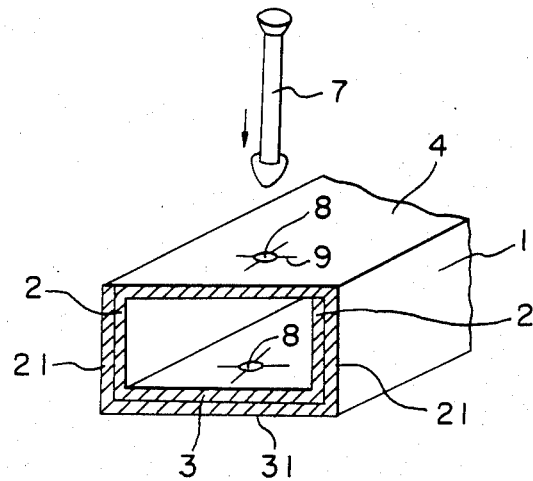
FIG. 1 is a perspective view illustrating a first embodiment of the present invention in which the magazine has a generally rectangular cross section and is made of a single folded sheet.

According to the present invention, magazines for electronic devices are prepared from a relatively thin sheet (a thickness of about 0.3 mm) and at least one and at most three walls constituting a tubular structure are partly or entirely formed by a double-sheet structure to provide adequate dimensional stability.

Referring to the drawings, the tubular magazine 1 is readily prepared by folding a flat sheet of a plastic such as polyvinyl chloride or polystyrene into a tubular structure having a rectangular or trapezoidal cross section and bonding the opposing end portions of the folded sheet. Antistatic treatment can readily be applied to the flat sheet before it is folded into the tubular structure. It is thereby possible to prevent generation of static electricity which is likely to damage integrated circuits placed in the tubular magazine.

Referring to FIG. 1, the tubular magazine is prepared by folding a plastic sheet along six lines to form a tubular structure of a generally rectangular cross section, with the sheet being overlapped and bonded to form a double-sheet structure over the entire side walls 2 and the entire bottom wall 3 as indicated at 21 and 31.

Figure 2:
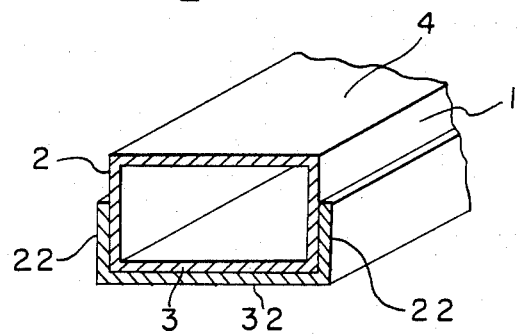
FIG. 2 is a perspective view of a second embodiment in which a tubular structure of a generally rectangular cross section made of a single folded sheet is backed up with a separate sheet to form a double-sheet structure.

FIG. 2 shows another embodiment of the present invention, in which a separate plastic sheet is bonded to the outside of a tubular structure 1 having a generally rectangular cross section to cover the entire bottom wall 3 and ⅔ of each side wall 2 as indicated at 32 and 22 and thereby to form a double-sheet structure. At least a lower half of each side wall should preferably be made to have the double-sheet structure. Otherwise, the magazine of a rectangular cross section tends to yield to an outer force applied thereto. The two sheets constituting the double-sheet structure are usually bonded to each other by an adhesive commonly used for bonding plastic materials.

With the above mentioned construction, the magazines of the present invention are hardly susceptible to deformation against an outer force applied thereto from the transverse direction, whereby the electronic devices inserted therein are adequately protected. Further, as the strength is enhanced by the double-sheet structure, a relatively thin sheet material may be used as the plastic sheet. When a transparent sheet material is used, any indications or symbol marks printed or attached to the electronic devices inserted in the magazines can readily be seen through the top wall which is made of a single thin plastic sheet. When it is desired to print an indication on the body of the magazine, such an indication may be printed prior to the folding of the sheet at a proper position of its surface so that, when folded, the printed surface is located inside of the double-sheet structure and thus it is protected from abrasion.

Figure 3:
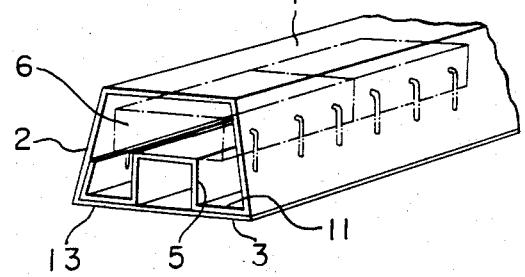
FIG. 3 is a perspective view of a third embodiment in which the magazine has a generally trapezoidal cross section and is provided on its bottom wall with a stand to support electronic devices thereon, said stand extending along the lengthwise center portion of the bottom wall.

Referring to FIGS. 3 and 4 illustrating a third embodiment of the present invention, the magazine for electronic devices 6 is formed by folding a flat plastic sheet into a tubular structure of a generally trapezoidal cross section. A stand 5 to support electronic devices 6 thereon is formed on the bottom wall 3 along its lengthwise center portion by folding the plastic sheet 11 inwardly of the tubular structure from the bottom wall. The bottom wall 3 is formed by a double-sheet structure except for the lengthwise center portion. In the illustrated embodiment, the double-sheet structure extends over the lower portion of one of the side walls 2.

In this embodiment, a flat sheet 13 extends over the entire bottom wall to reinforce the dimensional stability of the above described stand 5 which is otherwise susceptible to deformation when a force is applied from the transverse direction. By virtue of the trapezoidal structure, the magazine of this embodiment is dimensionally more stable than a simple rectangular structure. It is preferred that the double-sheet structure extends to the lower portion of at least one of the side walls 2 to reinforce the dimensional stability of the lower corner portion as indicated at 14. The whole structure of this embodiment is advantageously prepared from a single plastic sheet, and the overlapping sheet portions constituting the double-sheet structure are bonded to each other with an adhesive commonly used for bonding plastic materials. However, the double-sheet structure may be made by using a separate sheet in the same manner as described with respect to the second embodiment illustrated in FIG. 2.

FIG. 5 illustrates the fourth embodiment in which the magazine 1 is designed to accommodate electronic devices $C_1$ which have lead terminals B at one lower side of their packages A. Namely, a stand 5 to support the electronic devices $C_1$ thereon is formed at one inner lower corner of the tubular structure along its entire length. The stand 5 is formed by folding the plastic sheet 11 inwardly of the tubular structure from the side wall 2 and the bottom wall 3 defining the inner lower corner. The side wall and the bottom wall are formed by a double-sheet structure except for the inner lower corner portion where the stand 5 is formed.

FIG. 6 illustrates the fifth embodiment which is similar to the fourth embodiment, but in which the magazine 1 is designed to accommodate electronic devices $C_2$ which have lead terminals B along the lower center line of their packages A. Namely, a stand 5 to support the electronic devices $C_2$ thereon is formed at each inner lower corner of the tubular structure along its entire length. Both side walls 2 and the bottom wall 3 are formed by a double-sheet structure except for the inner lower center portions where the stands 5 are formed.

The sheet portions constituting the double-sheet structure are bonded to each other with a conventional adhesive for plastic materials.

Figure 7:
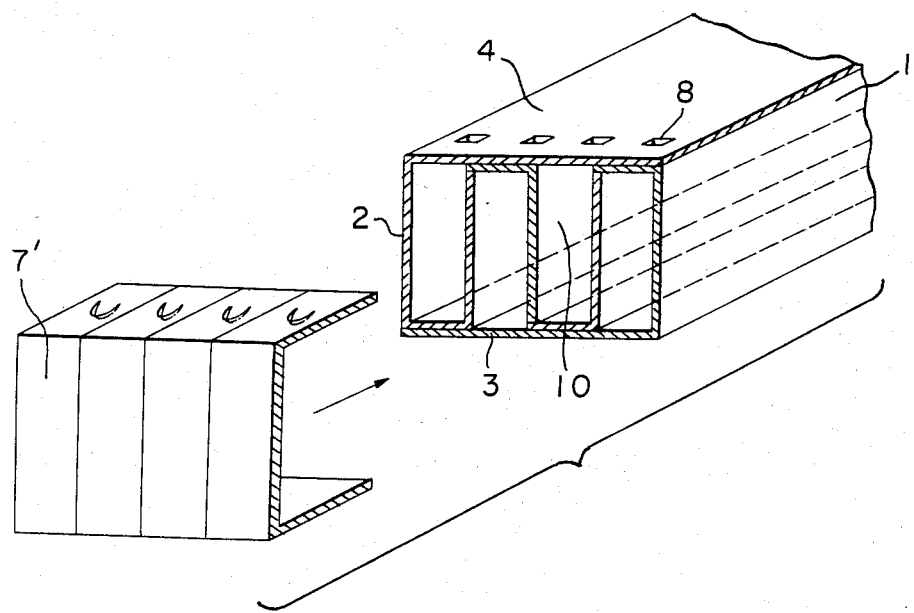
FIG. 7 is a perspective view of a sixth embodiment in which a rectangular cross sectional structure is divided by partitions formed by a folded sheet to form a plurality of compartments to receive electronic devices.

Referring to FIG. 7 which illustrates the sixth embodiment, the magazine 1 is provided with a plurality of lengthwise compartments 10 arranged in a side-by-side relation and each compartment 10 is adapted to receive electronic devices. The whole structure is made of a single plastic sheet. The sheet is folded to form a double-sheet structure at either the top wall or the bottom wall of each compartment and lengthwise partitions dividing the adjacent compartments. By virtue of the partitions and the double-sheet structure, the magazine has good dimensional stability.

It is possible to prepare a similar magazine by bonding a plurality of rectangular structures in a side-by-side relation and further bonding a separate sheet over the bottom walls of the rectangular structures. However, it is more advantageous to prepare the magazine from a single plastic sheet by folding it since the folding operation is simpler and more efficient and requires a less number of the process steps.

Since the electronic devices such as integrated circuits are susceptible to damages by static electricity, the inner surfaces of the magazines are usually antistatically treated. For instance, it is preferred that the entire inner surface of the magazine or at least the portion of the inner surface of the magazine which is in contact with the electronic devices, is formed with convexities and concavities, the concavities being contiguous to one another, and an electroconductive layer is provided in the concavities. Or, the portion of the inner surface which is in contact with the electronic devices is roughened and antistatically treated.

The magazines are usually provided at each open-end portion with a suitable stopper to prevent the inserted electronic devices from falling out from them. A pin-shaped stopper 7 is illustrated in FIG. 1. In this case, the opposing walls i.e. the bottom wall 3 and the top wall 4 at each end portion of the tubular structure, are provided with holes 8 to receive the pin-shaped stopper 7. For easy insertion or withdrawal of the pin-shaped stopper, it is preferred that at least one cut-line or slit 9 is formed at the periphery of each hole 8. Another example of the stopper is illustrated in FIG. 7. In this example, the stopper 7' has ⊐ shaped cross section corresponding the shape of the end portion of the magazine and is provided with tear-lines corresponding to the dividing lines, i.e. the partitions, of the compartments 10 so that each section of the stopper covering each open end of the compartment can be separated or torn off from the other section(s) along the tear-line(s).

Having thus described the construction of the magazines of the present invention, it should be apparent that the magazines of the present invention can be made of a relatively thin sheet and yet have good dimensional stability to adequately protect the inserted electronic devices and to ensure smooth movement of the devices in the magazines. The magazines of the present invention can readily be prepared by the simple folding operation in an economically advantageous manner, as compared with the conventional profile extrusion process.

What is claimed as new and desired to be secured by Letters Patent of the United States is:

1. A tubular magazine for containing one or more electronic devices, said tubular magazine:
   (a) having a uniform quadrilateral cross-section along its axial length;
   (b) said uniform quadrilateral cross-section being defined by a bottom wall, two side walls, and a top wall;
   (c) all four of said walls being formed from a single continuous, thin, transparent, flexible, quadrilateral, plastic sheet;
   (d) a stand to support one or more electronic devices thereon being formed on said bottom wall along a lengthwise portion thereof;

(e) one end of said sheet overlapping the opposite end of said sheet;

(f) said stand being formed from the inward one of said one end of said sheet and said opposite end of said sheet, said inward one of said one end of said sheet and said opposite end of said sheet making planar engagement with the outward one of said one end of said sheet and said opposite end of said sheet over a first longitudinal strip of said bottom wall and being spaced therefrom to define said stand over a second longitudinal strip of said bottom wall adjacent to said first longitudinal strip of said bottom wall; and (g) said one end of said sheet overlapping and being laminated to said opposite end of said sheet over the entire surface of said bottom wall except for said second longitudinal strip of said bottom wall, thereby giving said tubular magazine a resistance to deflection or twisting which it would not have without the overlap.

2. A tubular magazine as recited in claim 1 wherein said one end of said sheet additionally overlaps and is laminated to the opposite end of said sheet over at least a portion of one of said two side walls.

3. A tubular magazine as recited in claim 1 wherein said plastic sheet is made of polyvinyl chloride or polystyrene.

4. A tubular magazine as recited in claim 1 wherein said second longitudinal strip of said bottom wall is a center portion.

5. A tubular magazine as recited in claim 1 wherein said second longitudinal strip of said bottom wall is an edge portion.

6. A tubular magazine as recited in claim 1 wherein said plastic sheet is about 0.3 mm thick.

7. A tubular magazine as recited in claim 1 wherein:
   (a) at each end portion of the tubular structure, two opposing walls are provided with holes to receive a pin-shaped stopper and
   (b) at least one cut line or slit is formed in the periphery of each of said holes to facilitate entry of said pin-shaped stopper.

8. A tubular magazine for containing one or more electronic devices, said tubular magazine:
   (a) having a uniform quadrilateral cross-section along its axial length and being divided into a plurality of non-communicating, axially extending compartments each of which has a uniform quadrilateral cross-section along its length;
   (b) the uniform quadrilateral cross-section of said tubular magazine being defined by a bottom wall, two side walls, and a top wall;
   (c) said non-communicating, axially extending compartments extending from one of said walls to the opposite one of said walls;
   (d) all four of said walls and the walls of all of said compartments being formed from a single continuous, thin, transparent, flexible, quadrilateral plastic sheet; and
   (e) one end of said sheet overlapping the opposite end of said sheet and doubling back and forth upon itself sinuously to form said compartments, thereby giving said tubular magazine a resistance to deflection or twisting which it would not have without the overlap, each of said compartments being formed by the inward one of said one end of said sheet and said opposite end of said sheet, said inward one of said one end of said sheet and said opposite end of said sheet making planar engagement with and being laminated to the outward one of said one end of said sheet and said opposite end of said sheet at one end of each of said compartments, said one end of each of said compartments being opposite to said one end of the adjacent one of said compartments.

9. A tubular magazine as recited in claim 8 wherein said plastic sheet is made of polyvinyl chloride or polystyrene.

10. A tubular magazine as recited in claim 8 wherein said plastic sheet is about 0.3 mm thick.

11. A tubular magazine for containing one or more electronic devices, said tubular magazine:
    (a) having a uniform quadrilateral cross-section along its axial length;
    (b) said uniform quadrilateral cross-section being defined by a bottom wall, two side walls, and a top wall;
    (c) all four of said walls being formed from a single continuous, thin, transparent, flexible, quadrilateral, plastic sheet;
    (d) a stand to support one or more electronic devices thereon being formed on said bottom wall along a lengthwise portion thereof;
    (e) one end of said sheet overlapping the opposite end of said sheet;
    (f) said stand being formed from the inward one of said one end of said sheet and said opposite end of said sheet, said inward one of said one end of said sheet and said opposite end of said sheet making planar engagement with the outward one of said one end of said sheet and said opposite end of said sheet over a first longitudinal strip of said bottom wall and being spaced therefrom to define said stand over a second longitudinal strip of said bottom wall adjacent to said first longitudinal strip of said bottom wall;
    (g) the inward one of said one end of said sheet and said opposite end of said sheet making planar engagement with the outward one of said one end of said sheet and said opposite end of said sheet over a third longitudinal strip of said bottom wall adjacent to said second longitudinal strip of said bottom wall and on the opposite side of said second longitudinal strip of said bottom wall from said first longitudinal strip of said bottom wall;
    (h) said first, second, and third longitudinal strips of said bottom wall together composing the entirety of said bottom wall; and
    (i) said one end of said sheet overlapping and being laminated to said opposite end of said sheet over the entire surface of said bottom wall except for said second longitudinal strip of said bottom wall, thereby giving second tubular magazine a resistance to deflection or twisting which it would not have without the overlap.

12. A tubular magazine as recited in claim 11 wherein said plastic sheet is made of polyvinyl chloride or polystyrene.

13. A tubular magazine as recited in claim 11 wherein said plastic sheet is about 0.3 mm thick.

14. A tubular magazine as recited in claim 11 wherein at least a portion of the inner surface which is to be in contact with the electronic device(s) is formed with convexities and concavities, the concavities being contiguous to one another, and an electroconductive layer is provided in the concavities.

15. A tubular magazine as recited in claim 11 wherein at least the portion of the inner surface which is to be in contact with the electronic device(s) is roughened and antistatically treated.

16. A tubular magazine as recited in claim 11 wherein:
(a) at each end portion of the tubular structure, two opposing walls are provided with holes to receive a pin-shaped stopper and
(b) at least one cut line or slit is formed in the periphery of each of said holes to facilitate entry of said pin-shaped stopper.

* * * * *